United States Patent
Karavakis

(12) 
(10) Patent No.: US 6,500,528 B1
(45) Date of Patent: Dec. 31, 2002

(54) ENHANCEMENTS IN SHEET PROCESSING AND LEAD FORMATION

(75) Inventor: Konstantine Karavakis, Pleasanton, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/559,511

(22) Filed: Apr. 27, 2000

Related U.S. Application Data

(60) Provisional application No. 60/131,322, filed on Apr. 27, 1999.

(51) Int. Cl.$^7$ ................................................. B32B 3/00
(52) U.S. Cl. .................... 428/209; 257/690; 257/693; 257/700
(58) Field of Search ................................ 257/690, 693, 257/700; 428/209

(56) References Cited

U.S. PATENT DOCUMENTS

| | | | | |
|---|---|---|---|---|
| 5,168,344 A | * | 12/1992 | Ehlert et al. | 257/700 |
| 5,367,764 A | | 11/1994 | DiStefano et al. | 29/830 |
| 5,477,082 A | * | 12/1995 | Buckley, III et al. | 257/700 |
| 5,518,964 A | | 5/1996 | DiStefano et al. | 437/209 |
| 5,776,798 A | * | 7/1998 | Quan et al. | 438/112 |
| 5,909,056 A | * | 6/1999 | Mertol | 257/704 |
| 6,086,386 A | * | 7/2000 | Fjelstad et al. | 439/70 |
| 6,200,832 B1 | * | 3/2001 | Ahmad | 438/118 |
| 6,211,572 B1 | * | 4/2001 | Fjelstad et al. | 257/759 |
| 6,217,972 B1 | | 4/2001 | Beroz et al. | 428/68 |
| 6,228,685 B1 | | 5/2001 | Beroz et al. | 438/116 |
| 6,228,686 B1 | * | 5/2001 | Smith et al. | 438/117 |
| 6,320,739 B1 | * | 11/2001 | Gotoh et al. | 361/386 |

FOREIGN PATENT DOCUMENTS

WO    WO 98/28955    7/1998

\* cited by examiner

*Primary Examiner*—Cathy Lam
(74) *Attorney, Agent, or Firm*—Lerner, David, Littenberg, Krumholz & Mentlik, LLP

(57) ABSTRACT

A connection component for making microelectronic assemblies includes a dielectric structural layer having a first surface and a plurality of conductive leads having first and second ends overlying the first surface of the dielectric structural layer. An adhesive is provided between the second ends of the leads and the dielectric structural layer such that the adhesive forms connections between the second ends of the leads and the structural layer. The formed connections have areas smaller than the areas of the second ends. The second ends of the leads are releasably attached to the structural layer by the connections. Thus, the second ends of the leads may be engaged with features on a microelectronic device and the microelectronic elements may be moved away from the structural layer so as to bend the second ends of the leads away from the structural layer.

8 Claims, 2 Drawing Sheets

ENHANCEMENTS IN SHEET PROCESSING AND LEAD FORMATION

CROSS-REFERENCE TO RELATED APPLICATIONS

The present application claims benefit of United States Provisional Patent Application No. 60/131,322, filed Apr. 27, 1999, the disclosure of which is hereby incorporated by reference herein.

BACKGROUND OF THE INVENTION

As described in co-pending, commonly assigned U.S. patent application Ser. Nos. 09/173,797 and 09/174,074 both filed Oct. 16, 1998, the disclosures of which are incorporated by reference herein, sheet-like elements for use in microelectronic devices can be fabricated and/or assembled while the sheet-like element is held under tension and a frame. For example, a sheet for forming microelectronic connection components may incorporate dielectric layer such as a polyimide sheet. The polyimide sheet may be attached to a frame using an adhesive. The frame may be made of a relatively rigid material having a known, predictable coefficient of thermal expansion such as glass, quartz, or molybdenum. While the sheet is held in tension, features such as metallic leads, contacts and the like can be formed on the surfaces of the sheet by additive processes such as electroplating and/or subtractive processes such as etching. The sheet, with the features thereon, can be aligned with a microelectronic element such as a semiconductor wafer or an assemblage of discrete chips while the sheet is maintained on the frame. Because the sheet is maintained in tension by the frame, and because the frame has known, predictable thermal expansion properties, all of the features on the sheet can be maintained at precise locations relative to one another. The features on the sheet can be precisely aligned with features on the microelectronic element.

As disclosed in certain embodiments of U.S. Pat. No. 5,518,964, the disclosure of which is also incorporated by reference herein, leads can be fabricated on other supports such as dielectric bodies or semiconductor elements so that each lead has one end permanently anchored to the support and another end releasably attached to the support. The support, with the leads thereon, can be engaged with a microelectronic element so that the second ends of the leads are connected to contacts on the microelectronic element, whereupon the support is moved away from the microelectronic element to bend the leads. During this process, the releasable attachments to the support are detached.

As described in certain embodiments of co-pending, commonly assigned U.S. patent application Ser. No. 09/020,750 filed Feb. 9, 1998 and Ser. No. 09/195,371 filed Nov. 18, 1998, the disclosures of which are hereby incorporated by reference herein, a releasable lead structure can be made by providing a lead such as a metallic lead overlying a surface of a dielectric layer and exposing the surface, with the leads thereon, to an etchant such as an oxidizing plasma which attacks the dielectric but which does not substantially attack the material of the lead. The etchant removes the dielectric in areas not covered by the leads. Also, the etchant begins to remove material beneath the leads, starting at the edges of the leads and progressing inwardly from the edges of the leads toward the center. The etching process is stopped before the dielectric has been completely removed beneath all portions of the lead. This leaves the lead connected to the dielectric layer by a relatively small connecting element having an area smaller than the area in the horizontal plane of the lead. The process can be used to provide such small connecting elements as releasable connections at the second ends of the leads in structures such as those taught in the '964 patent.

The present invention provides certain enhancements to these processes.

SUMMARY OF THE INVENTION

One aspect of the invention provides a connection component for making microelectronic assemblies. The apparatus according to this aspect of the present invention preferably includes a structural layer having a first surface, a plurality of conductive leads each having a first end and a second end overlying the first surface of the dielectric structural layer, the first ends of the leads being permanently connected to the structural layer. Preferably, an adhesive is disposed between the second ends of the leads and the structural layer to form connections between the second ends of the leads and the structural layer. The connections desirably have areas smaller than the areas of the second ends, and the second ends of the leads may be releasably attached to the structural layer by the connections. Connection components according to this aspect of the invention can be used in a manner similar to the components of the aforementioned patents and applications. The use of the adhesive layer facilitates fabrication of the component.

The adhesive may extend between the first ends of the leads and the structural layer and forms anchors having areas larger than the areas of the second ends. The structural layer can include either a dielectric layer juxtaposed with the adhesive or a metallic layer. The component preferably further includes a frame overlying portions of the structural layer, the adhesive retaining the structural layer in engagement with the frame, the frame holding the structural layer in tension. Here again, use of the same adhesive layer to hold the leads and frame facilitates fabrication of the component.

A further aspect of the present invention provides a in-process component for making electronic connection components. The in-process component preferably includes a frame having structure defining an aperture and a sheetlike composite element including a structural layer having oppositely-directed first and second surfaces. A first adhesive layer desirably overlies the first surface of the structural layer. The composite element preferably includes peripheral portions overlying the structure of the frame and a central portion aligned with the aperture. Desirably, the adhesive layer extends into the peripheral portions and secures the structural layer to the frame. The adhesive layer also extends into the central portion of the composite element. The structural layer may include a dielectric layer. Desirably, the component further includes a metallic layer overlying the central portion of the composite element and secured to the structural layer by the adhesive layer. The in-process component may further include a second adhesive layer overlying the second surface of the structural layer, and may also include a metal layer overlying the second adhesive layer. The in-process component can be used, for example, to make connection components as discussed above.

Yet another aspect of the present invention provides a method of making a connection component with releasable leads. The method according to this aspect of the present invention preferably includes the steps of providing a structural layer and elongated leads having first and second ends overlying a first surface of the structural layer. Desirably, an adhesive is disposed between the structural layer and the second ends of the leads. The adhesive is preferably etched with an etchant which attacks the adhesive but does not substantially attack the leads so as to partially remove the adhesive beneath the second ends of the leads to thereby form connections having areas smaller than the areas of the second ends of the leads. Preferably, the adhesive is provided as a layer on the structural layer. A layer of metal is desirably provided overlying the structural layer and the layer of metal is selectively etched to form leads. An electrically conductive seed layer is preferably provided on the layer of adhesive and the leads are selectively plated onto the seed layer. The seed layer is then desirably removed except in the regions beneath the leads. A frame may also be provided to define an aperture such that the structural layer extends across the aperture, and the adhesive layer extends between the structural layer and the frame. The structural layer may then be secured to the frame.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
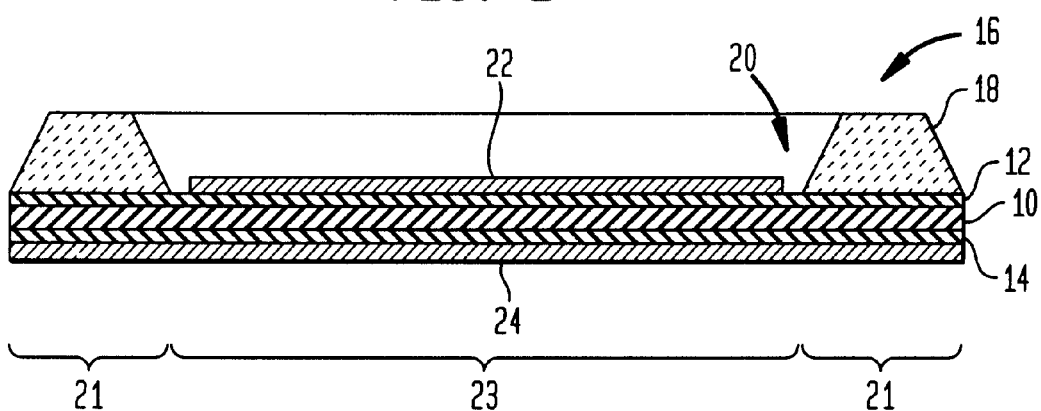
FIG. 1 is a diagrammatic sectional view, on an enlarged scale of a connection component in accordance with one embodiment of the invention.

A process in accordance with one embodiment of the invention begins with a starting structure including a structural layer 10 having a first adhesive layer 12 on a first surface and a second adhesive layer 14 on the oppositely-directed second surface of structural layer 10. The structural layer 10 is depicted in FIG. 1 as including only a single layer of a dielectric such as a polyimide. Such a single layer structure may be used in practice. However, more complex structures incorporating multiple dielectric layers and/or also incorporating internal conductive features such as vias, traces, and electrically conductive potential planes may also be used. The starting structure may be a structure of the type commonly referred to as a "bond ply."

The starting structure is bonded to a frame 16 having a structure 18 defining a central aperture 20. As further described in the aforementioned '797 and '074 applications, the frame 18 may be a generally a ring-like structure surrounding the aperture 20 on all sides. The first surface of structural layer 10 and first adhesive layer 12 faces toward the frame, whereas the second surface of structural layer 10 and the second adhesive layer 14 face away from the frame. Peripheral portions 21 of the structural layer are aligned with the frame, whereas a central portion 23 of the structural layer is aligned with aperture 20. Heat and pressure may be applied during the bonding step so as to activate the adhesive in a layer 12. Structural layer 10 desirably is maintained under tension during the bonding process. For example, edge portions of the structural layer (not shown) may be pulled outwardly during the bonding process. In the typical case where the structural layer 10 has a coefficient of thermal expansion ("CTE") greater than the CTE of the frame structure, the bonding operation is performed at a relatively high temperature so that upon cooling to other temperatures employed in subsequent processing, differential thermal expansion and contraction can maintain tension in structural layer 10.

After the structural layer has been secured to the frame by adhesive layer 12, a first metallic layer 22 and a second metallic layer 24 are formed on the first and second adhesive layers 12 and 14, respectively. Thus, layer 22 overlies the first surface of the structural layer 10, whereas layer 24 overlies the second surface of the structural layer. The metallic layers may be formed, for example, by depositing a "tie coat" or adhesion promoting layer, such as a seed layer, formed from a material such as nickel using a sputtering process and then depositing additional metal to form the layer by electroplating or electroless plating. Typically, the metal which forms the layer may be copper, gold, or alloy containing one or both of these metals.

The additional metal used to form the layers by electroplating or electroless plating can be deposited selectively onto the "tie coat" or adhesion promotion layer.

In an alternative, the metal layers may be applied to the starting structure before the frame, or preferably, simultaneously with the frame. For example, layers 22 and 24 can be bonded to the structural layer using the same adhesive layers 12 and 14 at the same time as the frame is bonded to the structural layer. Also, one of the metal layers may be formed by a plating process as discussed above whereas the other may be provided as a pre-laminated structure. For example, a continuous metal layer 24 may cover the bottom surface of the starting structure prior to joining the starting structure with the frame, whereas layer 22 may be formed in place after the frame has been attached.

Figure 2:
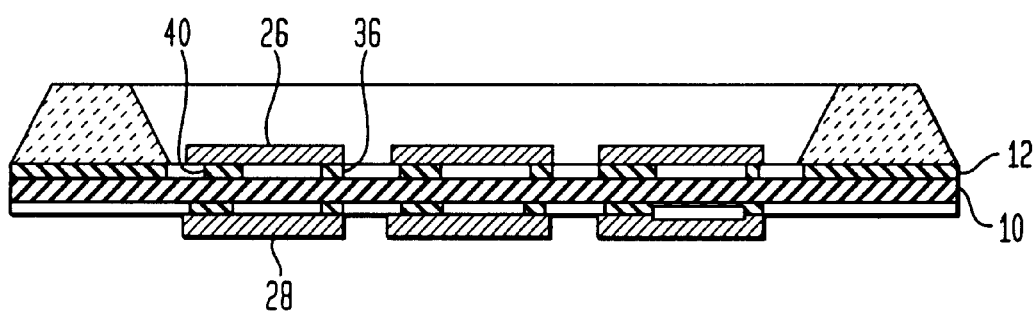
FIG. 2 is a view similar to FIG. 1 but depicting the component in a later stage of the process.

After the metal layers have been formed, they are treated to define a set of individual metallic features overlying the surfaces of structural layer 10. When a layer is formed selectively, the adhesion promotion layer and adhesive layer are removed, except in regions beneath the selectively formed layer. In the particular arrangement illustrated, leads 26, shown in FIGS. 2 and 3, are formed over the first surface 10 of the structural layer whereas leads 28 are formed on the downwardly facing or bottom surface of the structural layer.

Figure 3:
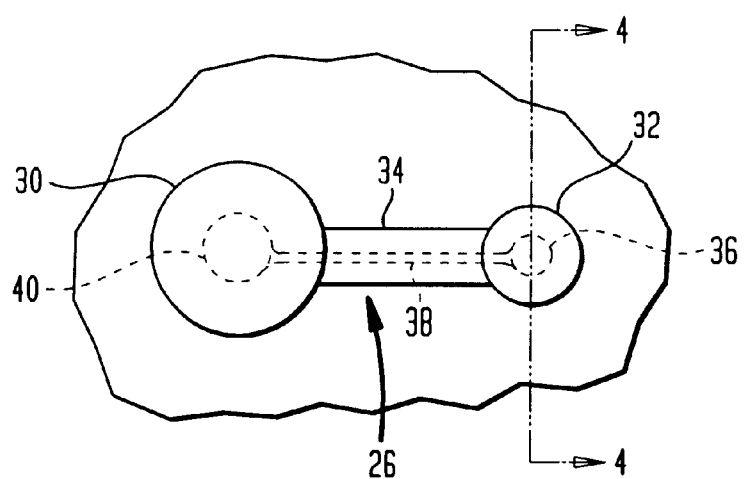
FIG. 3 is a fragmentary, diagrammatic plan view depicting a portion of the component illustrated in FIG. 2.
Figure 4:
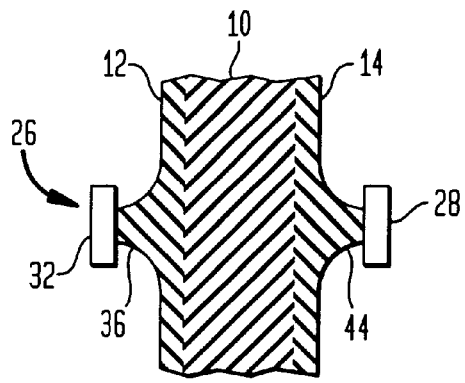
FIG. 4 is a fragmentary, diagrammatic sectional view taken along line 4—4 in FIG. 3.

As best seen in FIG. 3, each lead 26 has an enlarged first end 30, an enlarged second end 32 and an elongated section 34 which is narrower than the end sections 30 and 32. Following formation of the leads, the assembly is exposed to an etchant such as an oxidizing plasma as described in the aforementioned '750 and '371 applications the disclosures of which are hereby incorporated by reference herein. The etchant attacks the adhesive but does not substantially attack the material of the leads. The etching process removes adhesive material from layers 12 and 14. As best seen in FIG. 4, the etching process undercuts the lead and begins removing adhesive from beneath the lead, starting at the edges of the lead. The etching process is terminated before all of the adhesive material has been removed from beneath the leads. In particular, an end connector 36 remains beneath second end 32 of the lead. As best appreciated with reference to FIGS. 3 and 4, the connector 36 has an area smaller than the area of the lead second end. As used in this disclosure, the term "area" refers to area in a plane parallel to the adjacent surface of the support layer 10, unless otherwise indicated.

Depending upon when the etching process is terminated, there may be a strip-like connector 38 extending the beneath the elongated portion 34 of each lead. As will be appreciated from inspection of FIG. 3, the strip-like connector has a smaller area than the elongated region 34 of the lead. If the etching process is allowed to proceed further, the strip-like connector 38 may be removed entirely, whereas the end connector 36 remains. In a variant of the process, the enlarged section 32 at the second end of the lead is omitted and the process is controlled so that the strip-like connector 38 is formed and extends to adjacent to the second end of the lead.

A connector 40 also forms adjacent the first end 30 of the lead. The first ends 30 of the leads typically are anchored permanently to structural layer 10 by conductive structures (not shown) such as vias and the like extending into or through the conductive structure. These conductive structures also connect each lead with other conductive elements. For example, the vias may extend entirely though the support layers 10 and may connect leads 26 with leads 28 on the bottom surface. Connectors similar to those associated with leads 26 are formed between the second-surface leads 28 and the structural layer 10 as, for example, connectors 44 formed from portions of adhesive layer 14. The etching process may be controlled so as to affects only the adhesive layers 12 and 14; it does not damage the structural layer 10. In certain cases, particularly where the adhesive is thin, the entire adhesive layer may be removed during the etching process in those areas which are not covered by the leads. In this case, some portion of the underlying layer may be removed as well. Depending upon the composition of the adhesive and the underlying layer, the etch rate through the adhesive may be greater than the etch rate through the underlying layer, so that etching in those areas not covered by the leads slows or stops when the entire adhesive layer is removed.

The structure can be used in much the same manner as the structures described in the aforementioned '964 Patent and in the '750 and '371 applications. Thus, the second ends of the leads may be engaged with features on a microelectronic device and the microelectronic elements may be moved away from structural layer 10 so as to bend the second ends of the leads away from the structural layer. During this process, the connectors at the second ends, such as connectors 36 and 44 break or peel away from the leads or peel away from the structural layer.

Numerous variations of the processes discussed above can be utilized. For example, the leads may be formed by an additive process which deposits the leads on the adhesive without forming a full metal layer. Also, leads may be formed only on one side rather than on both sides of the structural layer. Other conductive features may be formed on the structural layer by similar processes. The particular processes discussed above utilize two aspects of the invention in combination: the use of the adhesive layer to attach the sheet to the frame and formation of releasable leads by etching the adhesive layer. These aspects can be used separately from one another. For example, a support structure may be attached using an adhesive layer as discussed above and processed to form elements other than leads. Also, etching of an adhesive layer to form releasable attachments for lead ends may be practiced using an adhesive layer on a support structure which is not mounted on a frame or which is attached to a frame by means other than those discussed above. The process can be applied to form releasable leads on a standard tape automated bonding ("TAB") type laminate, which typically includes a dielectric layer, an adhesive layer and a metal layer laminated to one another.

Figure 5:
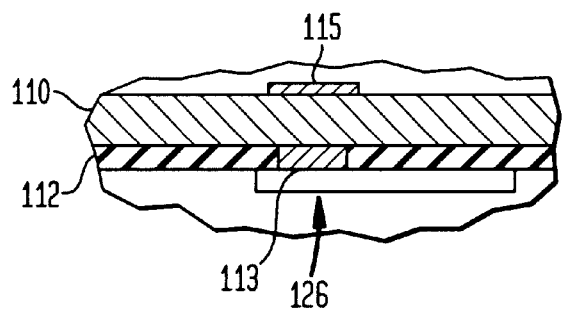
FIG. 5 is a fragmentary, diagrammatic sectional view depicting a component according to a further embodiment of the invention.
Figure 6:
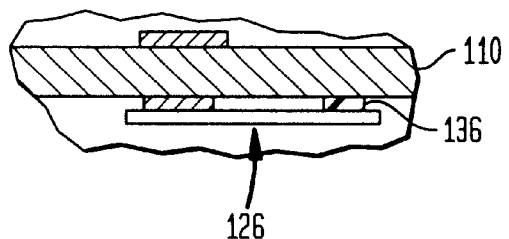
FIG. 6 is a view similar to FIG. 5 but depicting the component during a later stage of the process.
Figure 7:
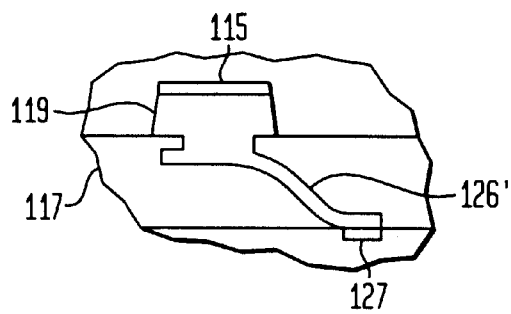
FIG. 7 is a view similar to FIG. 6 but depicting the component during a later stage of the process.

In a further embodiment of the invention, the support structure may include a metallic layer 110 (FIG. 5). The adhesive layer 112 is provided on a surface of the metallic layer and leads 126 are provided on the exposed surface of the adhesive layer. The leads 126 are connected by electrically conductive anchors 113 extending through the adhesive layer 112 at the first ends of the leads. Spots of an etch-resistant metal 115 are deposited on the second surface of the structural layer, opposite from the leads. Adhesive layer 112 is then etched to form connectors 136 at the second ends of leads 126. The second ends of the leads may be bonded to contacts 127 on a microelectronic element (FIG. 7). The microelectronic element is then moved away from support layer 110. As described in greater detail in PCT International Publication WO98/28955 the disclosure which is also hereby incorporated by reference herein and a copy of which is annexed hereto, encapsulant 117 is provided between the structural layer and the microelectronic component so the encapsulant surrounds the bent leads 126' (FIG. 7). The structural layer 110 (FIGS. 5 and 6) is exposed to an etchant which removes the structural layer except at the spots protected by etch-resistant metal 115, thereby forming terminals 119 connected to the leads.

The foregoing processes can be used to fabricate releasable leads and structures using releasable leads as taught in co-pending, commonly assigned United States Provisional Patent Applications No. 60/088,519 Jun. 8, 1998 and No. 60/087,286, filed May 29, 1998 the disclosures of which are hereby incorporated by reference herein. Certain aspects of the invention are further described in the following claims:

What is claimed is:

1. A connection component for making microelectronic assemblies comprising:
   (a) a structural layer having a first surface;
   (b) a plurality of conductive leads each having a first end and a second end overlying said first surface of said structural layer, the first ends of said leads being permanently connected to said structural layer; and
   (c) an adhesive disposed between the said second ends of said leads and said structural layer, said adhesive forming connections between said second end of said leads and said structural layer, said connections having areas smaller than the areas of said second ends, said second ends of said leads being releasably attached to said structural layer by said connections.

2. A connection component as claimed in claim 1 wherein an adhesive extends between said first ends of said leads and said structural layer and forms anchors having areas larger than the areas of said second ends.

3. A connection component as claimed in claim 1 wherein said structural layer includes a dielectric layer juxtaposed with said adhesive.

4. A connection component as claimed in claim 1 further comprising a frame overlying portions of said structural layer and an adhesive retaining said structural layer in engagement with said frame, said frame holding said structural layer in tension.

5. A connection component as claimed in claim 1 wherein said structural layer includes a metallic layer.

6. An in-process component for making electronic connection components comprising:

(a) a frame having structure defining an aperture; and
(b) a sheetlike composite element including a structural layer having oppositely-directed first and second surfaces, and a first adhesive layer overlying said first surface of said structural layer, said composite element extending across the aperture of said frame, said composite element including peripheral portions overlying said structure of said frame and a central portion aligned with said aperture, said adhesive layer extending into said peripheral portions and securing said structural layer to said frame, said adhesive layer also extending into said central portion of said composite element, wherein said structural layer includes a dielectric layer, the component further comprising a metallic layer overlying said central portion of said composite element and secured to said structural layer by said adhesive layer.

7. An in-process component as claimed in claim 6 further comprising a second adhesive layer overlying said second surface of said structural layer.

8. An in-process component as claimed in claim 7 further comprising a second metallic layer overlying said second adhesive layer.

* * * * *